United States Patent
Bera et al.

(10) Patent No.: US 10,679,860 B2
(45) Date of Patent: Jun. 9, 2020

(54) SELF-ALIGNING SOURCE, DRAIN AND GATE PROCESS FOR III-V NITRIDE MISHEMTS

(71) Applicant: Agency for Science, Technology and Research, Singapore (SG)

(72) Inventors: Lakshmi Kanta Bera, Singapore (SG); Yee Chong Loke, Singapore (SG); Surani Bin Dolmanan, Singapore (SG); Sudhiranjan Tripathy, Singapore (SG); Wai Hoe Tham, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 15/551,821

(22) PCT Filed: Mar. 9, 2016

(86) PCT No.: PCT/SG2016/050111
§ 371 (c)(1),
(2) Date: Aug. 17, 2017

(87) PCT Pub. No.: WO2016/144263
PCT Pub. Date: Sep. 15, 2016

(65) Prior Publication Data
US 2018/0033631 A1 Feb. 1, 2018

(30) Foreign Application Priority Data
Mar. 9, 2015 (SG) .............................. 10201501771

(51) Int. Cl.
*H01L 29/66* (2006.01)
*H01L 21/285* (2006.01)
(Continued)

(52) U.S. Cl.
CPC .. *H01L 21/28575* (2013.01); *H01L 21/28264* (2013.01); *H01L 29/2003* (2013.01);
(Continued)

(58) Field of Classification Search
CPC .................... H01L 29/66431; H01L 29/66462
See application file for complete search history.

(56) References Cited

U.S. PATENT DOCUMENTS 5,976,920 A * 11/1999 Nakano ............. H01L 21/28587
257/E21.407
2006/0019435 A1 1/2006 Sheppard et al.
(Continued)

FOREIGN PATENT DOCUMENTS

EP 2385544 A2 11/2011

OTHER PUBLICATIONS

International Search Report for PCT/SG2016/050111, 3 pages (dated Apr. 13, 2016).
(Continued)

*Primary Examiner* — Jae Lee
(74) *Attorney, Agent, or Firm* — Brian E. Reese; Dana M. Daukss; Choate, Hall & Stewart LLP

(57) ABSTRACT

A method for fabrication of high electron mobility transistor (HEMT) semiconductor devices is presented. The method includes providing a substrate, growing a HEMT layer structure on the substrate; and self-aligned common metal stack formation of source, drain and gate electrodes on the HEMT layer structure using a single lithographic mask.

21 Claims, 7 Drawing Sheets

260

(51) Int. Cl.
*H01L 29/51* (2006.01)
*H01L 29/20* (2006.01)
*H01L 29/778* (2006.01)
*H01L 21/28* (2006.01)
*H01L 29/205* (2006.01)
*H01L 29/40* (2006.01)
*H01L 29/45* (2006.01)
*H01L 29/49* (2006.01)

(52) U.S. Cl.
CPC .......... *H01L 29/205* (2013.01); *H01L 29/404* (2013.01); *H01L 29/452* (2013.01); *H01L 29/4958* (2013.01); *H01L 29/517* (2013.01); *H01L 29/66462* (2013.01); *H01L 29/7786* (2013.01); *H01L 29/7787* (2013.01)

(56) References Cited

U.S. PATENT DOCUMENTS

| 2011/0233689 A1* | 9/2011 | Hata | H01L 29/045 257/411 |
| 2014/0070226 A1* | 3/2014 | Alvarez | H01L 23/4827 257/76 |
| 2016/0079066 A1* | 3/2016 | Takada | H01L 21/283 257/409 |

OTHER PUBLICATIONS

Written Opinion for PCT/SG2016/050111, 6 pages (dated Apr. 13, 2016).

* cited by examiner

240

250

260

270

280

SELF-ALIGNING SOURCE, DRAIN AND GATE PROCESS FOR III-V NITRIDE MISHEMTS

CROSS-REFERENCE TO RELATED APPLICATIONS

This patent application is a National Stage Entry of International Patent Application No. PCT/SG2016/050111, filed on Mar. 9, 2016, which claims the benefit of priority from Singapore Patent Application No. 10201501771P filed on Mar. 9, 2015, the contents of each of which are hereby incorporated by reference in their entirety for all purposes herein.

TECHNICAL FIELD

The present invention generally relates to methods for semiconductor fabrication, and more particularly relates to methods for fabrication of self-aligned metal oxide semiconductor field effect transistors (MOSFETs) or self-aligned metal insulator semiconductor high electron mobility transistors (MISHEMTs) device fabrication.

BACKGROUND OF THE DISCLOSURE

The AlGaN/GaN-based high electron mobility transistors (HEMTs) are gaining maturity as evidenced from the fact that they have been available from commercial vendors since 2005. The technology development helped to evolve several commercial companies such as those making GaN/AlGaN on Si epiwafers and device makers. Despite the development of commercial epitaxy and device products, research and development still progresses to improve several areas in HEMTs such as epitaxial growth of GaN on 200 mm Si with high breakdown voltage, CMOS compatible processing for HEMTs, and enhancement mode HEMTs processes. One example of development in GaN/AlGaN technology is a project which aims to develop GaN-based normally-off high power switching transistors for efficient power converters. In addition, there are worldwide consortia focusing on the commercialization of GaN products for electronic devices.

As the technology of GaN growth on Si matures, the problems of developing reduced cost silicon compatible device processing is being addressed. The device performance and device cost are mainly determined by process materials, material quality, and various device process steps. The present issues for Si compatible GaN device processes are:

(i) Non-gold based metals are showing good contacts for GaN/AlGaN system, yet as compared to gold-based processes, CMOS-compatible gold-free processes are incompatible with conventional HEMT fabrication.

(ii) No common metal stack is available for source, drain and gate electrodes.

(iii) Source, drain and gate self-align processes using a single mask in a single lithography process step for GaN/AlGaN based HEMTs process are not available.

(iv) Gate, source and drain field plate processes using a single mask is challenging as a result of a need for processing steps to be flexible.

Thus, what is needed is a method for fabrication of HEMTs which which at least partially overcomes the drawbacks of present approaches and provides gold-free CMOS compatible metal stacks for source, drain and gate. Furthermore, other desirable features and characteristics will become apparent from the subsequent detailed description and the appended claims, taken in conjunction with the accompanying drawings and this background of the disclosure.

SUMMARY

According to at least one embodiment of the present invention a method for fabrication of high electron mobility transistor (HEMT) semiconductor devices is provided. The method includes providing a substrate, growing a HEMT layer structure on the substrate; and self-aligned common metal stack formation of source, drain and gate electrodes on the HEMT layer structure using a single lithographic mask.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

FIG. 2, comprising FIGS. 2A to 2I, illustrates planar schematic views at various stages of the process flow of FIG. 1 for the single mask self-align common metal stack at source, drain and gate to fabricate MISHEMTs in accordance with the present embodiment, wherein FIGS. 2A to 2G depict side planar cross-sectional device architectures at various stages of the process flow of FIG. 1 and FIGS. 2H and 2I depict top planar cross-sectional device architectures at two stages of the process flow of FIG. 1.

FIGS. 3A, 3B and 3C, illustrates graphs of operational characteristics of AlGaN/GaN HEMTs fabricated on Si(111) in accordance with the present embodiment, wherein FIG. 3A depicts a graph of drain-source current $I_{DS}$ (mA/mm scale) versus drain-source voltage ($V_{DS}$) for various gate-source voltages ($V_{GS}$), FIG. 3B depicts a graph of drain-source current $I_{DS}$ (mA/mm scale) versus gate-source voltage ($V_{GS}$) for various drain-source voltages ($V_{DS}$), and FIG. 3C depicts a graph of drain-source current $I_{DS}$ (mA/mm scale) and transconductance $g_m$ (mS/mm) versus gate-source voltage ($V_{GS}$) for various drain-source voltages ($V_{DS}$).

Figure 1:
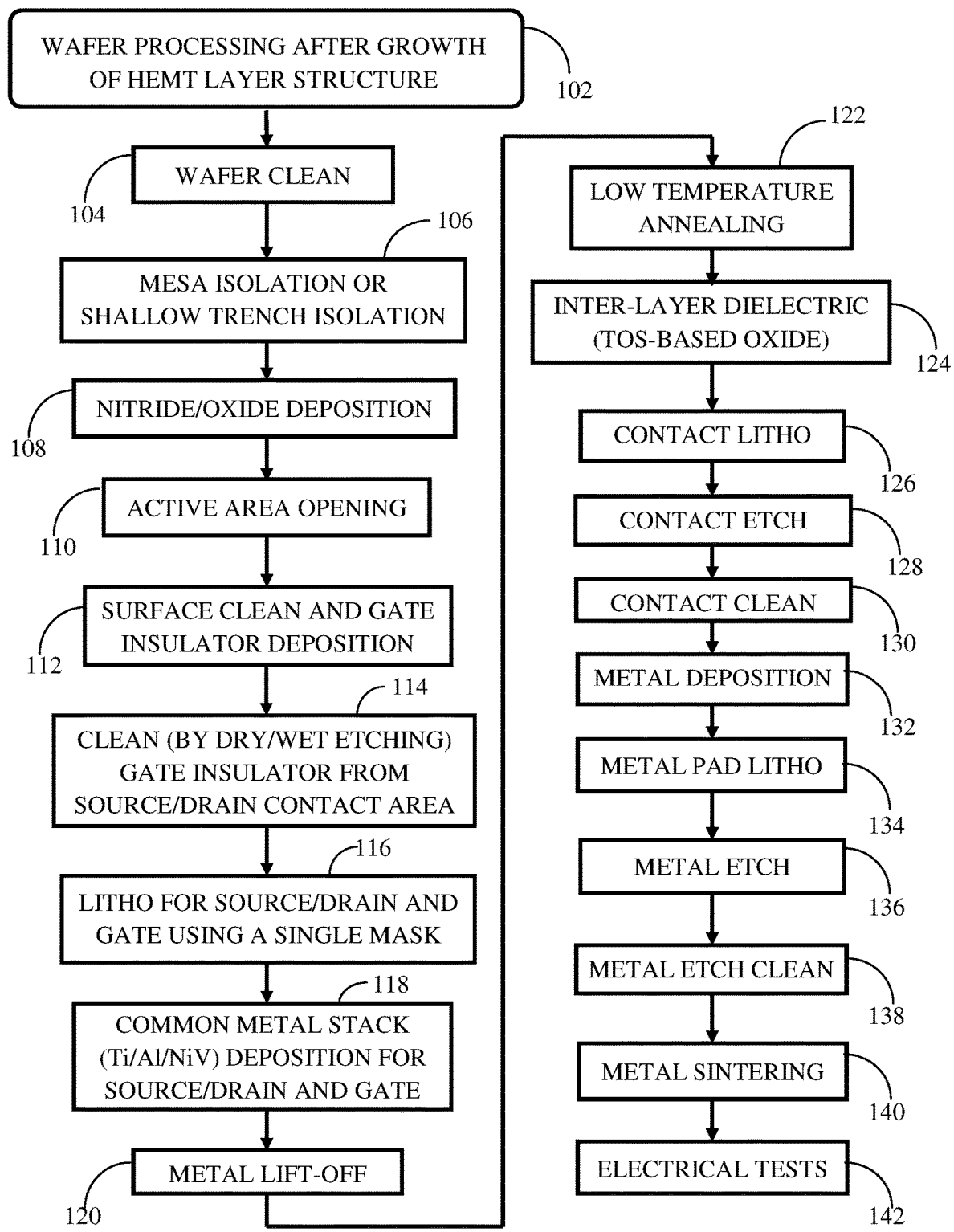
FIG. 1 illustrates a process flow for a single mask self-align common metal stack at source, drain and gate to fabricate metal insulator semiconductor high electron mobility transistors (MISHEMTs) in accordance with the present embodiment.

Skilled artisans will appreciate that elements in the figures are illustrated for simplicity and clarity and have not necessarily been depicted to scale. For example, the device structures depicted in FIG. 2 are greatly magnified for ease of viewing.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description. It is the intent of the present embodiment to present a method for fabrication of gallium nitride (GaN) based metal insulator semiconductor high electron mobility transistors (MISHEMTs) with a gold-free complementary metal oxide semiconductor (CMOS) compatible common metal stack for source/drain/gate using a single mask self-align process technology. The method for fabrication is based on a common metal stack formed with a low temperature annealing process for the fabrication of the source/drain and the gate contact electrodes. The common metal stack for the source, drain and gate in a transistor configuration further allows the fabrication process to utilize a single mask for source, drain and gate electrode formation.

In addition, the device fabrication process in accordance with the present embodiment includes self-aligned metal oxide semiconductor field effect transistor (MOSFET) or MISHEMT device fabrication using group III nitride material systems on bulk-silicon or silicon-on-insulator (SOI), sapphire or silicon carbide (SiC) substrates. The single mask process for source, drain and gate in accordance with the present embodiment can further integrate source, drain and gate field plates for the enhancement of breakdown voltage of III-nitride MISHEMTs. The low-temperature metal stack annealing process also leads to elimination of defects and impurities which generally occur during high temperature semiconductor processing.

In accordance with the present embodiment, the common metal stack includes Ti/Al/NiV metal layering on AlGaN/GaN HEMT epitaxial layers and includes a gate stack comprising atomic layer deposition (ALD) formed high-K gate dielectrics. The metal compound nickel vanadium (NiV) reduces the oxidation of the metal stack during annealing to form the ohmic contacts at the source and the drain for the HEMTs. In accordance with the present embodiment, ohmic contact formation on the III-nitride surface is annealed at a low annealing temperature between 450° C. to 500° C. This low temperature contact processing offers an improved method to integrate the gate electrode for the MISHEMTs fabrication.

In accordance with the present embodiment, the Ti/Al/NiV metal gate formation on III-nitride is advantageously a CMOS compatible processes and the single mask source, drain and gate process is fully self-aligned. Unlike conventional CMOS processes to make symmetric devices, the single mask process in accordance with the present embodiment has the advantages of being capable of fabricating symmetric and asymmetric transistors. The processing flexibility in the device fabrication steps is useful for integrating GaN based systems with Si CMOS compatible platforms thereby providing a scalable and CMOS compatible MISHEMT fabrication process.

Referring to FIG. 1, a process flow 100 for a single mask self-aligned common metal stack at source, drain and gate to fabricate metal insulator semiconductor high electron mobility transistors (MISHEMTs) in accordance with the present embodiment is depicted. Initially, the GaN/AlGaN HEMT layers are grown 102 on a silicon substrate, a silicon-on-insulator (SOI) substrate, a sapphire substrate or a silicon carbide (SiC) substrate. The fabrication process 100 is a multistep process which, after growth of the HEMT layer structure, includes a wafer clean 104 (i.e., a special clean of the III-V semiconductors); isolation of the HEMT structure 106; gate dielectric deposition 108; a lithography and dry etching process to clear the gate dielectric from a source drain active region 110; a post etch clean and gate insulator deposition 112; dry/wet etching to clear the high-K gate insulator from the source drain active region 110; lithography using a single mask for source, drain and gate 116; common metal stack (Ti/Al/NiV) deposition 118 for the source, drain and gate electrodes; and a metal lift-off process 120 followed by low temperature annealing 122 of the source, drain and gate electrodes. Thus, in accordance with the present embodiment: (i) a common metal stack deposition 118 is performed after a gate insulator etching and clean process 114, (ii) lithography for the source, drain and gate 116 advantageously uses a single mask; and (iii) dry etching is performed 120 on the common metal stack.

The remainder of the process includes: standard interlayer dielectric (ILD) deposition 124; a lithography for contact formation 126; etching the contact 128; cleaning the contact 130; metal deposition 132, lithography 134 and etching 136 for formation of metal pads; metal etch cleaning 138 and metal sintering 140 followed by electrical tests 142. The electrical tests 142 have shown that MISHEMTs fabricated in accordance with the process 100 have characteristics which include an ON-OFF ratio greater than $10^8$.

FIGS. 2A to 2I illustrate planar schematic views at various stages of the process flow 100. In accordance with the present embodiment, the HEMT layer structure is depicted in a side planar cross-sectional 200 (FIG. 2A) and includes a substrate 202 having a layer of aluminum nitride (AlN) 204 epitaxially grown thereon. A gallium nitride (GaN) layer 206 is epitaxially grown on the AlN layer 204 after which an aluminum gallium nitride (AlGaN) layer 208 is grown on the GaN layer to form two-dimensional electron gas (2DEG) heterostructures 210 at the interface thereof. The AlGaN/GaN-based MISHEMTs layer structure is completed with a GaN layer 212 epitaxially grown on the AlGaN layer 208. In accordance with the present embodiment, the substrate 202 may be sapphire, SOI, SiC, or a bulk GaN substrate. The AlGaN/GaN HEMT epilayers 204, 206, 208, 212 can be grown by a metal organic chemical vapor deposition process. An exemplary layer structure sequence may be as follows: (a) the AlN layer 204 is first grown on the Si (111) surface of the substrate 202 followed by about a 1.5 micrometer AlGaN intermediate layer 205 of varying Al content, (b) an unintentionally doped (UID) GaN layer 206 of 1.5 μm is thick grown on top of the AlGaN intermediate layer 205, and (c) top HEMT layers comprising a 1.0-1.5 nm AlN spacer layer, a ~20 nm $Al_xGa_{1-x}N$ barrier layer 208 (Al: 22-23%), and a three to four nanometer thin GaN cap 212 are grown on the AlGaN intermediate layer. Based on device configuration requirements, the thickness of the top GaN layer 212 can be tuned with undoped or p-type Mg-doped GaN. However, the present embodiment is not limited to use the aforementioned HEMT layer structure but applicable to any HEMT wafers grown on SiC, sapphire, SOI, or bulk GaN substrates.

Figure 2A:
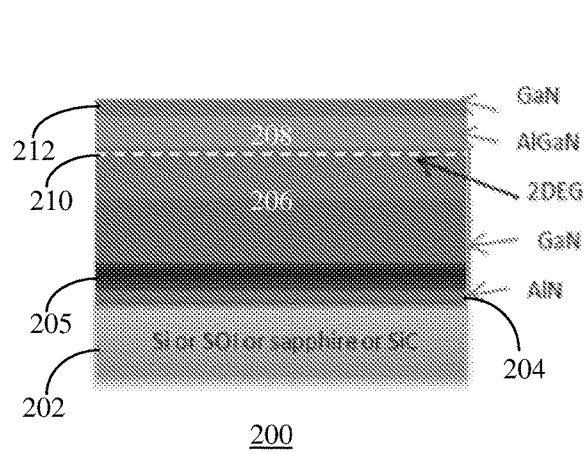
Figure 2B:
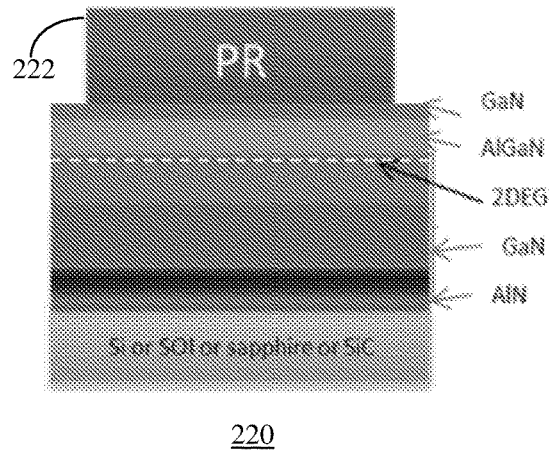
Figure 2C:
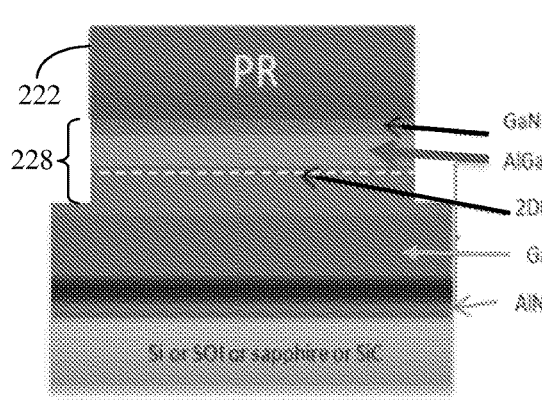

After epitaxial growth of the HEMT layer structure 102 and prior to processing of devices, the epitaxial wafer needs to be cleaned 104 using III-nitride compatible chemistry. After substrate clean 104, an isolation module is fabricated 106 on the substrate 202. The device isolation scheme 106 can be either a shallow trench isolation (STI) process or a simple mesa isolation process. As depicted in FIGS. 2B and 2C, a mesa isolation scheme 220, 225 is used to define an active area pattern by depositing a photoresist layer 222 and inductively coupled plasma (ICP) or reactive ion etching (RIE) of GaN-based layers 228 using $Cl_2/BCl_3$ chemistry.

Figure 2D:
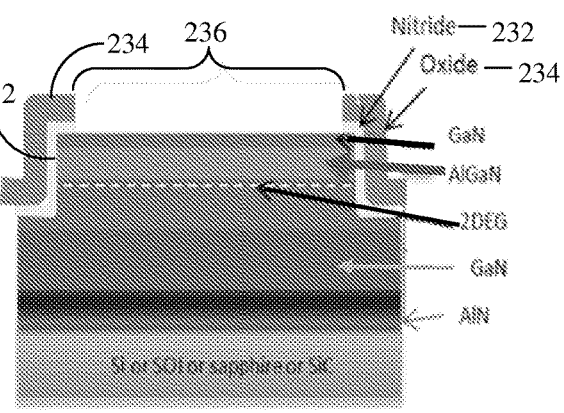

Referring to FIG. 2D, a side planar cross-sectional view 230 depicts that after device isolation 106, the gate oxide stack is formed 108 by depositing on a thin nitride layer 232 a thirteen nanometer $Al_2O_3$ oxide layer 234 at 300° C. by atomic layer deposition (ALD) using alternating pulses of $Al(CH_3)_3$ and $H_2O$ as the precursors. Then an active area 236 is opened 110 by etching away the central portion of the nitride layer 232 and the oxide layer 234.

Figure 2E:
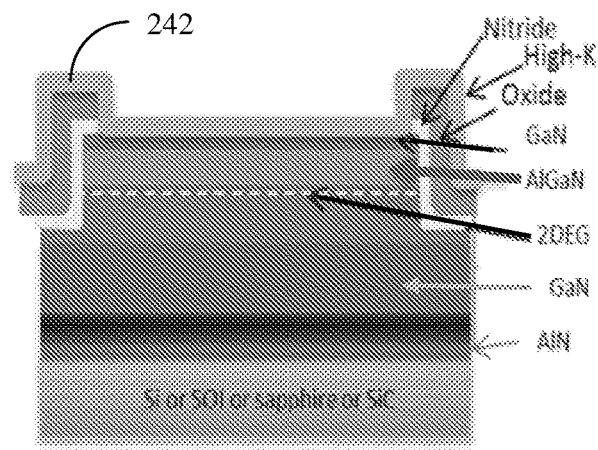

Referring next to FIG. 2E, a side planar cross-sectional view 240 depicts the gate insulator high-k dielectric deposition 112. Depending on applications, $HfO_2$ and $Al_2O_3$ or other high-k dielectrics or the combinations thereof can be configured as the gate insulator dielectric layer 242.

Figure 2F:
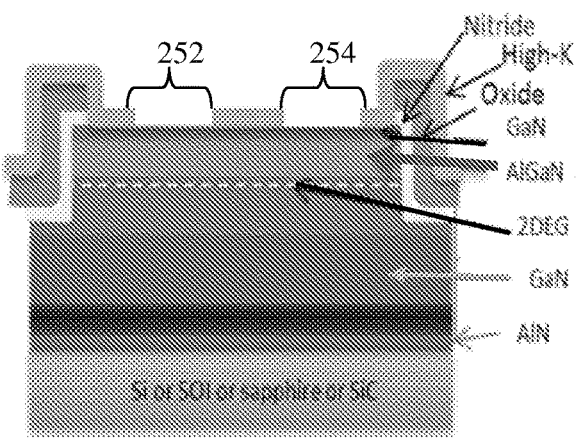

Referring to FIG. 2F, a side planar cross-sectional view 250 depicts opening 114 of the gate insulator high-k dielectric layer 242. To clear the gate insulator 242 to open source/drain areas 252, 254, a lithography and etching process are performed. A dry etching process can use $Al_2O_3$ to etch the gate insulator 242. Wet chemistry can also be used depending on the gate insulator layer's properties. After etching 114 of the gate insulator 242 from the S/D areas 252, 254, the wafer is cleaned by wet chemistry.

Figure 2G:
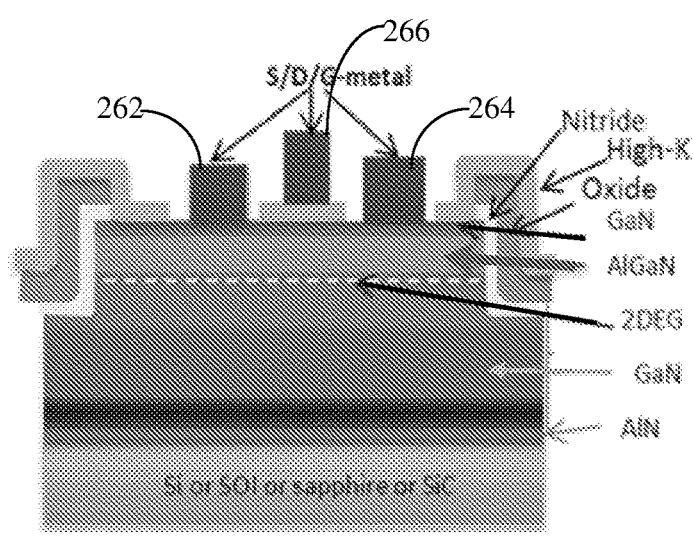

Referring to FIG. 2G, a side planar cross-sectional view 260 depicts the wafer after source/drain 262, 264 and gate 266 formation using a single mask. In accordance with the present embodiment, after wafer clean 114 there are two process schemes for the formation of the source/drain structures 262, 264 and the gate structure 266 using a single mask. The first process involves a lift off process including a lithography step 116 using a single mask followed by a metal deposition step 118 which deposits the metal source/drain and gate structures 262, 264, 266 through the single mask followed by metal lift off 120. An alternate second process involves a metal etching process including an initial metal deposition step followed by lithography using a single mask and metal etching the source/drain structures 262, 264 and the gate structure 266 through the single mask.

Figure 2H:
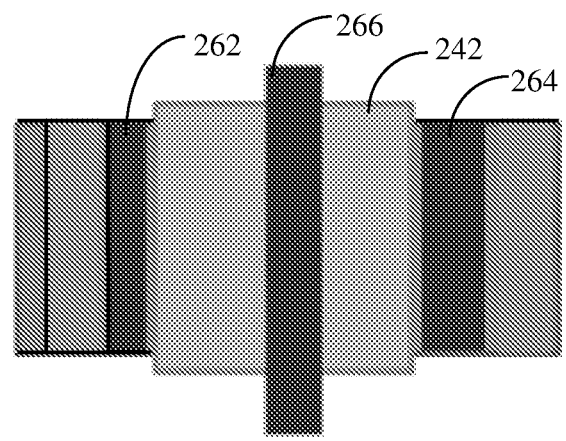
Figure 2I:
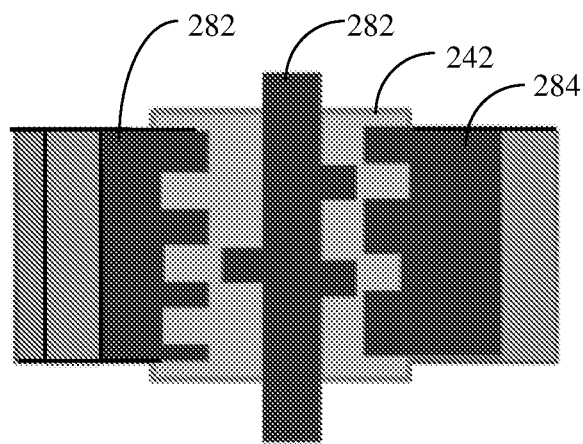

The lift-off process 120 (FIG. 1) in accordance with the present embodiment can advantageously use a single lithographic mask process for fabricating the source, the drain, the gate, symmetric architecture, asymmetric architecture, capacitors, vertical and lateral breakdown test structures, transmission lines, double gate RF transistors, split CV structures and other structures. Referring to FIG. 2H, a top planar view 270 the source/drain structures 262, 264 and the gate structure 266 fabricated through the single mask process in accordance with the present embodiment. Other structures such as source, drain, and gate field plates can also be integrated in this mask. Referring to FIG. 2I, a top planar view 280 depicts source and drain field plates 282, 284 and a gate field plate 286 formed over the gate insulator high-k dielectric layer 242.

For the common metal stack formation of the source, drain and gate 118 (FIG. 1), CMOS compatible metal Ti/Al/NiV is deposited using a physical vapor deposition (PVD) process after etching of the gate insulator from the source and the drain areas 114. The thickness of the layers deposited in the metal stack is tuned to obtain a reasonable ohmic contact resistance using low temperature thermal annealing 122. Thus, after the metal lift-off process 120, the metal stack is subjected to rapid thermal annealing (RTA) for ohmic contact formation at the source and the drain 122. In accordance with the present embodiment, the annealing temperature is in the range of 450° C. to 500° C. and the low temperature annealing 122 is performed for thirty to sixty seconds.

In order to scale the devices, the common metal stack for source/drain and gate can also be formed by dry plasma etching processes. The scaling of device dimensions, G/D and G/S access regions, gate metal structures, field plate structures with gaps of finger/fish bone strips are defined by the resolution of the lithographic method used. For example, either deep ultraviolet lithography, extreme ultraviolet lithography, immersion lithography or E-beam lithography can be used, each having a corresponding resolution which will define the scaling of the device dimensions.

The process steps shown in FIGS. 1 and 2 can be optimized with various deposition and annealing conditions for fabrication of various device architectures in GaN-based HEMTs using the process steps as described hereinabove. Thus, in accordance with the present embodiments, a non-gold based CMOS compatible common metal stack process for GaN-based MISHEMT fabrication has been presented. After low temperature rapid thermal annealing, it can be seen that the common metal stack has formed ohmic contacts at the source and the drain. The lower thermal budget for source and drain ohmic contact formation allows the common metal stack process in accordance with the present embodiments to promote gate electrode formation of the MISHEMTs. Therefore, the common metal scheme for source, drain and gate formation allows a self-aligned single mask process for source, drain and gate fabrication of MISHEMTs on III-nitride 2DEG substrates.

Figure 3:
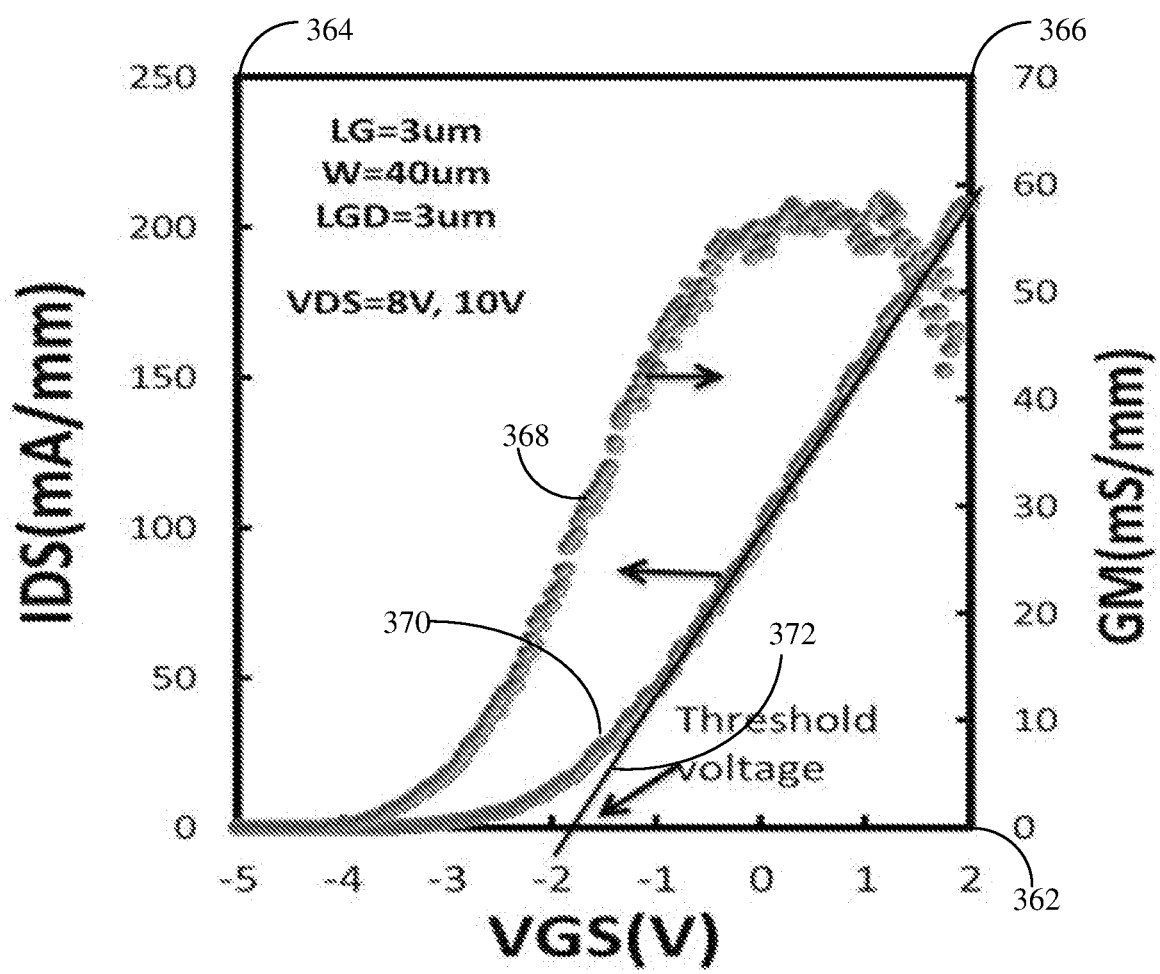
FIG. 3, comprising

Referring to FIG. 3, experimental results of devices fabricated in accordance with CMOS compatible device processing for III-nitride layers on bulk-Si substrates in accordance with the present embodiment are shown. FIG. 3, comprising FIGS. 3A to 3C, depicts the DC characteristics of AlGaN/GaN-based MISHEMTs fabricated on bulk-Si using common metal stack fabrication for source, drain and gate in accordance with the present embodiment in graph 300 (FIG. 3A), graph 330 (FIG. 3B), and graph 360 (FIG. 3C).

The source/drain/gate metal stacks are formed using a single mask process. In this process, the ohmic contacts are formed at the source and the drain in the presence of the gate metal stack, a process step which is not possible in standard HEMT fabrication. In standard HEMT fabrication, the source and drain metal is deposited and annealed at a high temperature to form the ohmic contacts before the gate electrode formed. If high temperature annealing is performed after gate electrode formation then the gate electrode metal will diffuse through the gate dielectric rendering the HEMT device unworkable. The DC characteristics for HEMT transistor devices fabricated in accordance with the present embodiment exhibit $I_{DS}$-$V_{DS}$, $I_{DS}$-$V_{GS}$ and transconductance ($g_m$) characteristics as shown in the graphs 300, 330, 360, respectively.

Figure 3A:
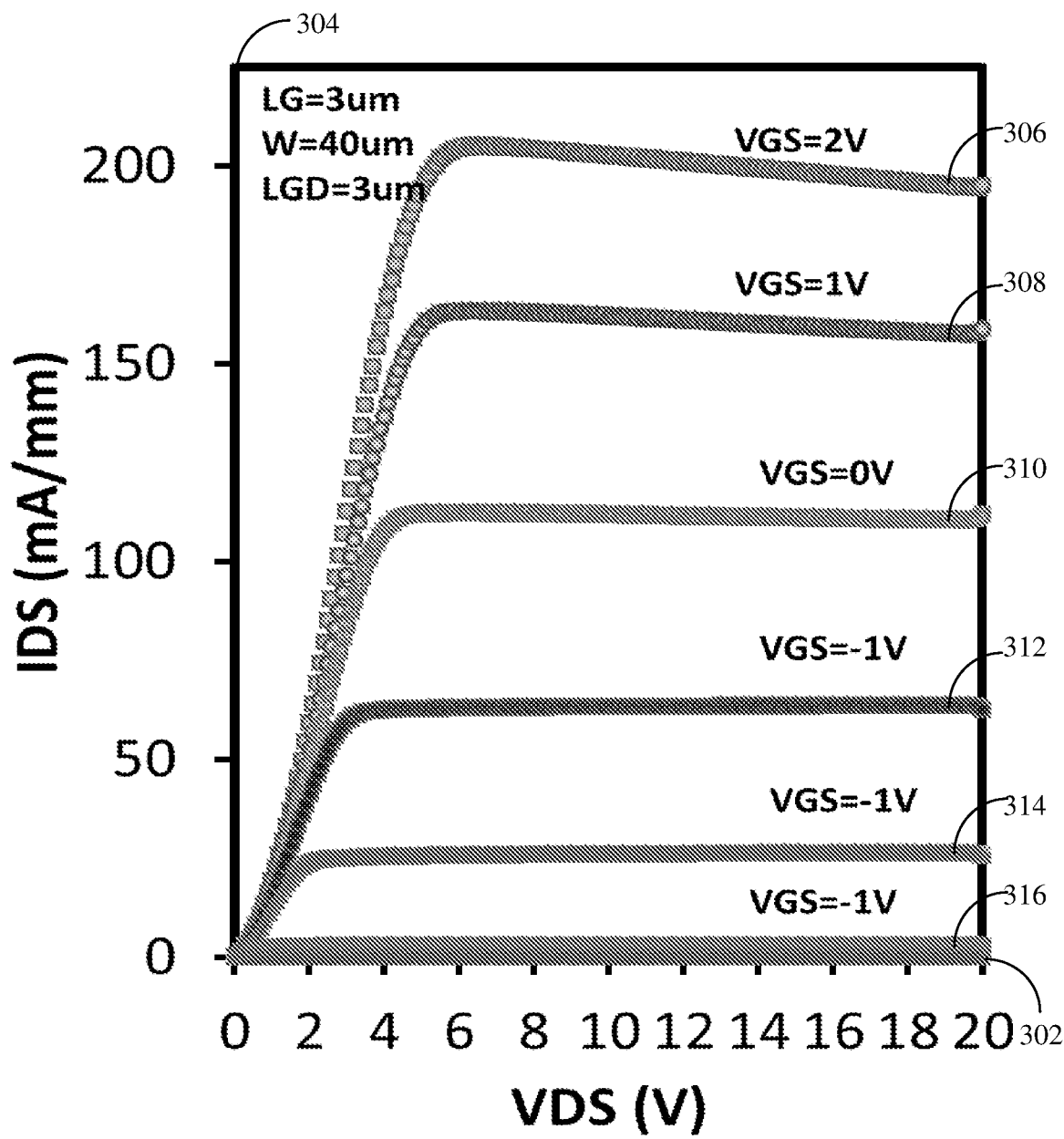

Referring to FIG. 3A, the graph 300 plots the drain-source voltage ($V_{DS}$) in volts (V) along a x-axis 302 and the drain-source current ($I_{DS}$) in milliamps per millimeter (mA/mm) along a y-axis 304. From the graph 300, the gate-source voltage ($V_{GS}$) traces 306, 308, 310, 312 show that at a gate-source voltage of two volts 306, the $I_{DS}$ (saturation drain current) and $V_{DS}$ are approximately two hundred milliamps per millimeter and six volts; at a gate-source voltage of one volt 308, the $I_{DS}$ and $V_{DS}$ are approximately one hundred fifty milliamps per millimeter and five volts; at a gate-source voltage of zero volts 310, the $I_{DS}$ and $V_{DS}$ are approximately one hundred milliamps per millimeter and four volts; and at a gate-source voltage of negative one volt 312, the $I_{DS}$ and $V_{DS}$ are approximately fifty milliamps per millimeter and three volts. At the gate-source voltage of negative one volt 314, 316, $I_{DS}$ and $V_{DS}$ are approximately twenty milliamps per millimeter and two volts (trace 314) and approximately five milliamps per millimeter and one volt (trace 316).

Figure 3B:
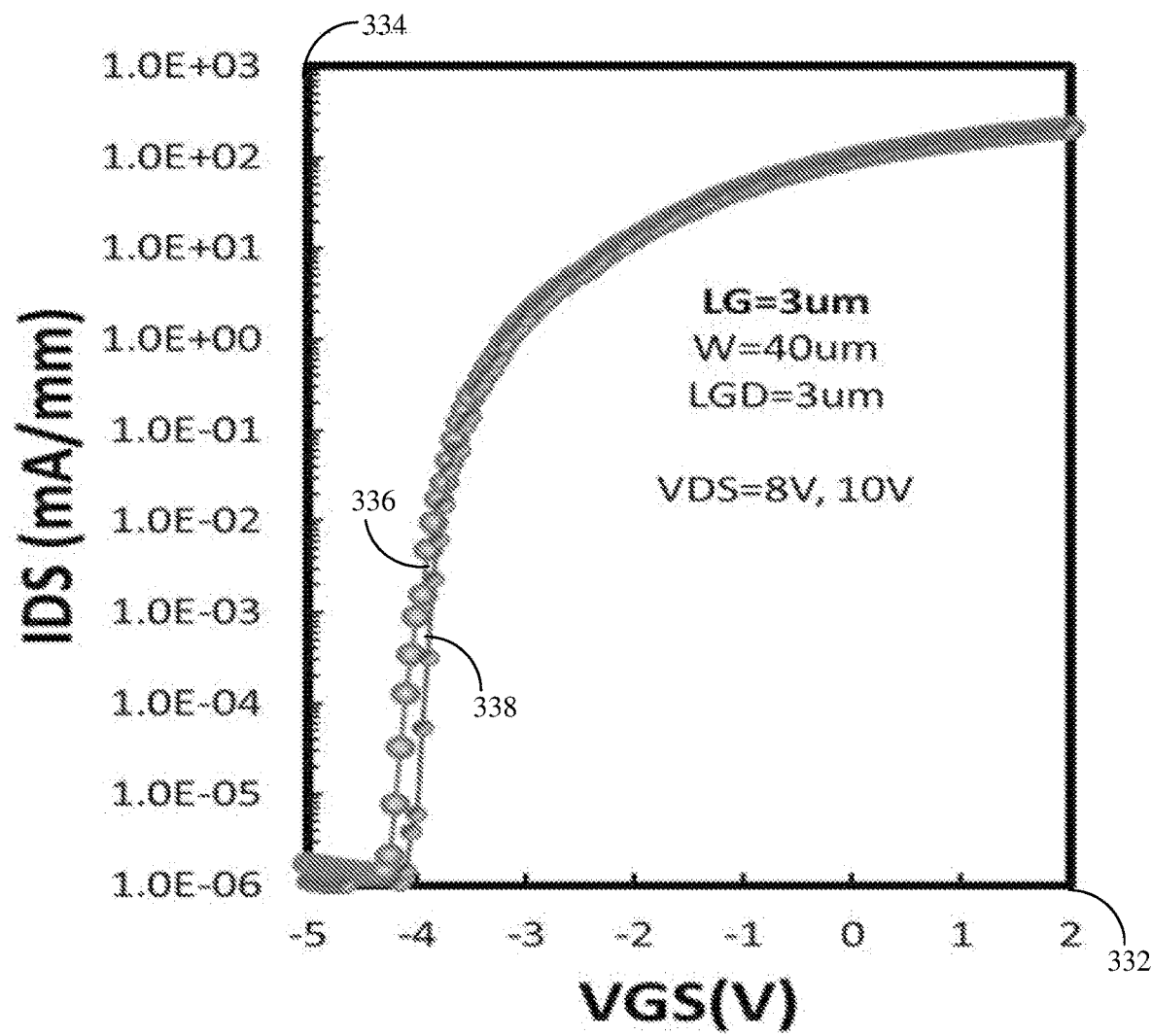

Referring to FIG. 3B, the graph 330 plots the gate-source voltage ($V_{GS}$) in volts (V) along a x-axis 332 and the drain-source current ($I_{DS}$) in milliamps per millimeter (mA/mm) along a y-axis 334. From the graph 330, the drain-source voltage ($V_{DS}$) traces 336, 338 show that a transistor ON-OFF ratio can be greater than $10^8$ (i.e., a ratio of 1.0E+02 to 1.0E-06) at drain-source voltages of eight volts 336 and ten volts 338. The transistor ON-OFF ratio greater than $10^8$ evidences application potential of these devices for power switching applications.

Referring to FIG. 3C, the graph 360 plots the gate-drain voltage ($V_{GS}$) in volts (V) along a x-axis 362, the drain-source current ($I_{DS}$) in milliamps per millimeter (mA/mm) along a left-side y-axis 364, and the transconductance ($g_m$) in millisiemens per millimeter (mA/mm) along a right-side y-axis 366. From the graph 360, the drain-source voltage ($V_{DS}$) traces 368, 370 show no significant change of threshold voltage as the drain-source voltage changes from eight volts to ten volts.

The good transfer characteristics in FIG. 3C are consistent with the quality of the gate stack. Due to the reduced gate capacitance arising from $Al_2O_3$ incorporation as the gate dielectric, a lower transconductance peak of 60 mS/mm in this HEMT structure is realized with $L_G$ of 3.0 micrometer. With a further reduction of $L_G$, the maximum saturation drain current and transconductance will increase.

Thus, it can be seen that the present embodiment can provide gold-free CMOS compatible metal stack formation for source, drain and gate. The metal stacks form ohmic contacts at very low temperature and therefore diffusion of metal through the gate insulator can advantageously be avoided. The common metal stacks for the source, drain and gate electrodes are formed using a single mask, thereby providing a scalable, efficient MISHEMT fabrication process. In addition, the single mask common stack source, drain and gate electrode formation process in accordance with the present embodiment provides a self-aligning symmetric and asymmetric device process to fabricate MISFETs using AlGaN/GaN HEMT grown on bulk Si substrates.

In accordance with the present embodiments, a fabrication process for III-nitride-based metal insulator semiconductor high electron mobility transistors (MISHEMTs) is presented which is gold-free complementary metal oxide semiconductor (CMOS) compatible for source (S), drain (D) and gate (G) formation on GaN/AlGaN/AlN/GaN, InAlN/AlN/GaN, or InAlGaN/AlN/GaN based two-dimensional electron gas (2DEG) heterostructures grown on silicon and the device integration includes a self-aligned CMOS contact formation process with a common metal stack scheme for source, drain and gate creation. The common metal stack scheme used for source, drain and gate formation forms Ti/Al/NiV electrodes, wherein the thickness of the titanium layer can vary in the range of 15-25 nanometers (nm), the thickness of aluminum layer can vary in the range of 175-225 nm, and the thickness of the nickel-vanadium alloy layer can vary from 50-70 nm. Ohmic contacts are formed at the source and drain from the common metal stack by low temperature annealing in the range of 450° C. to 500° C., preferably by rapid thermal annealing at 475° C.

In accordance with the present embodiment, the low temperature based new metal stacks process for source and drain contact formation is also a gate electrode formation process wherein the gate dielectric can be a material selected from $Al_2O_3$, $HfO_2$, or a combination of $Al_2O_3/HfO_2$ and $Al_2O_3/Ta_2O_5$. The process leading to single mask formation of the source, drain and gate electrodes for fabrication of MISHEMTs on III-nitride 2DEG substrates grown on silicon as described hereinabove is also applicable to the formation of the source, drain and gate electrodes on III-nitride epitaxial layers grown on sapphire, SiC, SOI, or bulk GaN substrates. The single mask process for formation of the source, drain and gate electrodes is advantageously a self-align process for device fabrication which depends on only one lithography step. The self-aligned single lithography mask may include several test structures or device structures such as source/drain/gate structures, symmetric and asymmetric HEMTs structures with capacitors, vertical and lateral breakdown test structures, transmission lines, double gate RF transistors, or split CV structures. Other structures such as source, drain and gate field plates can advantageously be integrated in this single mask which is not possible in conventional HEMT processes. In addition, the self-aligned single mask utilized in the fabrication process in accordance with the present embodiment is also applicable for the fabrication of enhancement mode type MISHEMT devices based on p-GaN capped AlGaN/AlN/GaN 2DEG heterostructures.

While exemplary embodiments have been presented in the foregoing detailed description of the invention, it should be appreciated that a vast number of variations exist. It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

What is claimed is:

1. A method for fabrication of high electron mobility transistor (HEMT) semiconductor devices, the method comprising:
   providing a substrate;
   growing a HEMT layer structure on the substrate; and
   self-aligned common metal stack formation of source, drain and gate electrodes on the HEMT layer structure using a single lithographic mask, wherein the self-aligned common metal stack formation step using the single lithographic mask comprises the steps of:
   providing the single lithographic mask; and
   depositing metal through the single lithographic mask, wherein the self-aligned common metal stack when deposited over non-metallic high-k dielectric layers acts as the gate electrode and forms the source and drain electrodes when directly deposited on a non-metallic gallium nitride-based layer, and wherein the self-aligned common metal stack formation comprises formation of the source electrode on a bandgap semiconductor, the drain electrode on the bandgap semiconductor, and the gate electrode on an insulator as a gate dielectric.

2. The method in accordance with claim 1 wherein the self-aligned common metal stack formation step comprises forming a common metal stack for the source, drain and gate electrodes using the single lithographic mask by forming one or more of a layer of titanium (Ti), a layer of aluminum (Al) and a layer of nickel vanadium (NiV) alloy.

3. The method in accordance with claim 2 wherein a thickness of the layer of Ti is in the range of fifteen to twenty-five nanometers (nm), a thickness of the layer of Al is in the range of 175 to 225 nm, and a thickness of the layer of NiV alloy is from fifty to seventy nanometers.

4. The method of claim 2, wherein the common metal stack is a metal stack of Ti/Al/NiV.

5. The method of claim 1, further comprising forming the gate dielectric on the HEMT layer structure before the step of self-aligned common metal stack formation of the source, drain and gate electrodes.

6. The method in accordance with claim 5 wherein the step of forming the gate dielectric comprises depositing and patterning a high-k dielectric layer on the HEMT layer structure.

7. The method in accordance with claim 6 wherein the high-k dielectric layer comprises one or more of $Al_2O_3$, $HfO_2$, $Al_2O_3/HfO_2$ or $Al_2O_3/Ta_2O_5$.

8. The method of claim 1, wherein the self-aligned common metal stack formation step using a single lithographic mask comprises providing a single lithographic mask for forming the source, drain and gate electrodes and one or more of symmetric HEMT device structures, symmetric HEMT test structures, asymmetric HEMT device structures, asymmetric HEMT test structures, capacitors, vertical and lateral breakdown test structures, transmission lines, double gate radio frequency (RF) transistors, and split CV structures.

9. The method of claim 1, wherein the self-aligned common metal stack formation step using a single lithographic mask comprises providing a single lithographic mask for forming the source, drain and gate electrodes and source, drain and gate field plates.

10. The method of claim 1, wherein the substrate comprises a substrate material selected from the group comprising a silicon substrate, a silicon-on-insulator (SOI) substrate, a sapphire substrate, a silicon carbide (SiC) substrate or a bulk gallium nitride (GaN) substrate.

11. The method of claim 1, wherein the step of growing the HEMT layer structure on the substrate comprises epitaxially growing the HEMT layer structure using a metal organic vapor deposition process.

12. The method of claim 1, wherein the step of growing the HEMT layer structure on the substrate comprises growing a HEMT layer structure comprising two-dimensional electron gas (2DEG) heterostructures.

13. The method of claim 1, wherein the step of growing the HEMT layer structure on the substrate comprises growing a HEMT layer structure comprising one or more of an aluminum nitride (AlN) layer, a gallium nitride (GaN) layer, an aluminum gallium nitride (AlGaN) layer, an indium aluminum nitride (InAlN) layer, an indium aluminum gallium nitride (InAlGaN) layer, an undoped GaN cap layer, and a p-type doped GaN cap layer.

14. The method of claim 1, further comprising low temperature annealing of the source and drain electrodes to form ohmic contacts thereon.

15. The method in accordance with claim 14 wherein the low temperature annealing step comprises rapid thermal annealing of the source and drain electrodes to form the ohmic contacts.

16. The method of claim 14, wherein the low temperature annealing step comprises low temperature annealing of the source and drain electrodes at annealing temperature in the range of 450° C. to 500° C. for thirty to sixty seconds to form the ohmic contacts.

17. The method of claim 1, wherein the method for fabrication of HEMT semiconductor devices is a gold-free complementary metal oxide semiconductor (CMOS) compatible self-aligned metal insulator semiconductor high electron mobility transistor (MISHEMTs) device fabrication process.

18. The method of claim 1, wherein the method for fabrication of HEMT semiconductor devices is a self-aligned metal insulator semiconductor high electron mobility transistor (MISHEMTs) device fabrication process.

19. The method of claim 1, wherein the method for fabrication of HEMT semiconductor devices is a III-nitride-based metal insulator semiconductor high electron mobility transistor (MISHEMTs) device fabrication process.

20. The method of claim 1, wherein the method for fabrication of HEMT semiconductor devices is an enhancement mode type MISHEMT device fabrication process based on p-GaN capped AlGaN/AlN/GaN 2DEG heterostructures.

21. The method of claim 2, wherein the common metal stack is formed of Ti/Al/NiV on nitride structures.

* * * * *